(12) United States Patent
Hou et al.

(10) Patent No.: US 8,643,397 B2
(45) Date of Patent: Feb. 4, 2014

(54) TRANSISTOR ARRAY FOR TESTING (75) Inventors: Hsin-Ming Hou, Tainan (TW); Ji-Fu Kung, Taichung (TW)

(73) Assignee: Untied Microelectronics Corp., Hsinchu (TW)

( * ) Notice: Subject to any disclaimer, the term of this patent is extended or adjusted under 35 U.S.C. 154(b) by 248 days.

(21) Appl. No.: 13/245,504

(22) Filed: Sep. 26, 2011

(65) Prior Publication Data

US 2013/0076388 A1    Mar. 28, 2013

(51) Int. Cl.
*G01R 31/02* (2006.01)
(52) U.S. Cl.
USPC .................................................. 324/762.09
(58) Field of Classification Search
USPC .................. 324/762.01–762.1, 750.1–750.3; 257/48; 438/14–18
See application file for complete search history.

(56) References Cited

U.S. PATENT DOCUMENTS

| | | | |
|---|---|---|---|
| 6,530,068 B1 | 3/2003 | Cao et al. .......................... 716/8 |
| 7,397,259 B1 * | 7/2008 | Agarwal et al. .......... 324/762.09 |
| 7,408,372 B2 | 8/2008 | Agarwal et al. ................ 324/765 |
| 7,589,538 B2 * | 9/2009 | Novikov et al. .............. 324/676 |
| 2006/0104152 A1 | 5/2006 | Martin et al. .................. 365/244 |

OTHER PUBLICATIONS

Brad Smith et al., "A Novel Biasing Technique for Addressable Parametric Arrays" IEEE Transactions on Semiconductor Manufacturing, vol. 22, No. 1, Feb. 2009, pp. 134-145.
Kanak Agarwal et al., "Characterizing Process Variation in Nanometer CMOS" Design Automation Conference, (2007), DAC '07. 44th ACM/IEEE, pp. 396-399.

* cited by examiner

*Primary Examiner* — Tung X Nguyen
(74) *Attorney, Agent, or Firm* — J.C. Patents (57) ABSTRACT

A transistor array for testing is provided. The transistor array includes a plurality of tested units. Each of the tested unit includes a tested transistor and a first to third switches. The tested transistor has a control terminal, a first and a second terminals and a bulk. The first switch is coupled between the first terminal and a leakage transporting line. The second switch is coupled between the second terminal and the leakage transporting line. The third switch is coupled between the control terminal and a bias providing line. The first to third switches are turned on or turned off according to a control signal. When the tested transistor is selected to be tested, the first to third switches are turned on according to the control signal.

11 Claims, 6 Drawing Sheets

TRANSISTOR ARRAY FOR TESTING

BACKGROUND OF THE INVENTION

1. Field of the Invention

The invention relates to a transistor array for testing. Particularly, the invention relates to a method for reducing leakage current of a non-selected tested transistor in a transistor array for testing.

2. Description of Related Art

In order to learn electrical characteristics presented by circuit devices of various wafers, a designer generally disposes a plurality of test keys at a non-device area of the wafer, and obtains the electrical characteristics of the electronic devices of each region in the wafer by measuring the electrical characteristics of the test keys.

In a conventional technique domain, test keys of a so-called addressable transistor array are provided. The test keys formed by the transistor array can effectively use a limited space of the non-device area, and a maximum number of the transistors can be disposed thereto for measurement. Regarding the transistor array, any of the transistors can be tested through an addressing method by only configuring a common measurement pad, and configuration of an independent measurement pad for each of the transistors to be tested is unnecessary. In this way, the designer can obtain enough amounts of data through such transistor array without consuming a large wafer area.

However, in the transistor array of the conventional technique, the transistor that is not selected for testing may have a so-called sub-threshold leakage phenomenon, and since the number of the transistors that are not selected for testing is relatively large, a total leakage current may lead to an error testing result of the selected transistor.

SUMMARY OF THE INVENTION

The invention is directed to a transistor array for testing, in which a leakage current of a non-selected tested transistor is reduced, and test accuracy of a selected tested transistor is improved.

The invention provides a transistor array for testing. The transistor array includes a plurality of tested units. Each of the tested units includes a tested transistor and a first to third switches. The tested transistor has a control terminal, a first terminal, a second terminal and a bulk. The first switch is coupled between the first terminal of the tested transistor and a leakage transporting line. The second switch is coupled between the second terminal of the tested transistor and the leakage transporting line. The third switch is coupled between the control terminal of the tested transistor and a bias providing line. The first to third switches are turned on or turned off according to a control signal. When the tested transistor is not selected, the first to third switches are turned on according to the control signal.

According to the above descriptions, by using a plurality of switches, when the tested transistor is not selected, the first terminal and the second terminal of the tested transistor are short-circuited to the leakage transporting line, and a cross voltage of the first terminal and the second terminal of the tested transistor is equal to 0 volt, and residual charges on the first terminal and the second terminal of the tested transistor are taken away by the leakage transporting line, so as to reduce an interference on a whole test result of the transistor array caused by the leakage current generated by the tested transistor that is not selected. Moreover, the back-end bias providing line and the bias providing line are used to provide voltages to the bulk and the control terminal of the tested transistor that is not selected, so as to reduce the leakage current generated by the tested transistor that is not selected.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
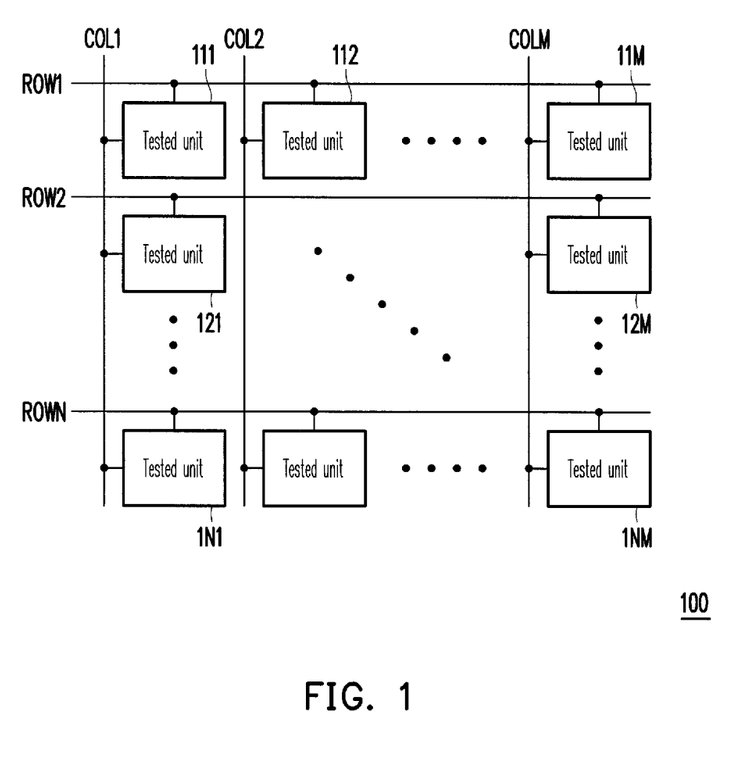
FIG. 1 is a schematic diagram illustrating a transistor array 100 for testing.

Referring to FIG. 1, FIG. 1 is a schematic diagram illustrating a transistor array 100 for testing. The transistor array 100 includes tested units 111-1NM. The tested units 111-1NM are arranged in an array, where M and N are positive integers. The tested units 111-1NM are respectively connected to column addressing lines COL1-COLM and row addressing lines ROW1-ROWN. When one of the tested units 111-1NM is selected for testing, one of the column addressing lines COL1-COLM and one of the row addressing lines ROW1-ROWN are used to transmit signals to the one of the tested units 111-1NM that is selected for testing. The other tested units that are not selected are disabled according to signals provided by the other row addressing lines and/or column addressing lines (i.e. the non-selected tested units are turned off without operation).

Figure 2A:
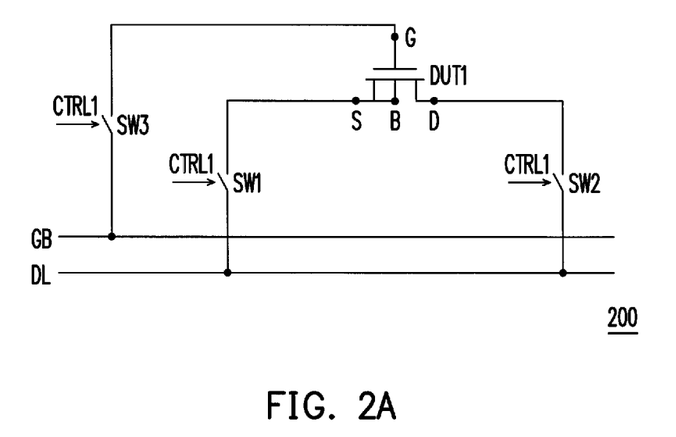
FIG. 2A is a schematic diagram of a tested unit 200 according to an embodiment of the invention.

Referring to FIG. 2A, FIG. 2A is a schematic diagram of a tested unit 200 according to an embodiment of the invention. The tested unit 200 includes a tested transistor DUT1 and switches SW1-SW3. The tested transistor DUT1 has a control terminal G, a first terminal S, a second terminal D and a bulk B. The switch SW1 is coupled in series between the first terminal S of the tested transistor DUT1 and a leakage transporting line DL. The switch SW2 is coupled in series between the second terminal D of the tested transistor DUT1 and the leakage transporting line DL. The switch SW3 is coupled in series between the control terminal G of the tested transistor DUT1 and a bias providing line GB. In the present embodiment, the bulk B and the first terminal S of the tested transistor DUT1 are coupled to each other, and the tested transistor DUT1 is, for example, an N-type metal oxide semiconductor field effect transistor (NMOSFET), where the first terminal S is, for example, a source, the second terminal D is, for example, a drain and the control terminal G is, for example, a gate.

It should be noticed that the switches SW1-SW3 are turned on or turned off according to a control signal CTRL1. When the tested transistor DUT1 is not selected, the switches SW1-SW3 are all turned on according to the control signal CTRL1.

Namely, when the tested transistor DUT1 is not selected (i.e. not selected for testing), the first terminal S and the second terminal D of the tested transistor DUT1 are short-circuited to the leakage transporting line DL through the conducted switches SW1 and SW2. In this way, a leakage current generated by the tested transistor DUT1 is taken away by the leakage transporting line DL, so as to avoid influencing a test result of a selected tested transistor. Moreover, by short-circuiting the first terminal S and the second terminal D of the tested transistor DUT1 to the leakage transporting line DL, a cross voltage of the first terminal S and the second terminal D of the tested transistor DUT1 is reduced to the minimum, which greatly reduces a current value of the leakage current probably generated by the tested transistor DUT1.

On the other hand, the control terminal G of the tested transistor DUT1 can be directly connected to the bias providing line GB through the conducted switch SW3. In the present embodiment, the bias providing line GB is used for providing a bias voltage to the control terminal G of the tested transistor DUT1, and a turned-on or turned-off status of the tested transistor DUT1 can be controlled by the bias voltage provided from the bias providing line GB.

It should be noticed that by providing the back-end bias voltage of a negative voltage value to the bulk B of the tested transistor DUT1, a threshold voltage of the tested transistor DUT1 can be effectively enhanced, so as to reduce the current value of the leakage current probably generated by the tested transistor DUT1 that is not selected.

Figure 2B:
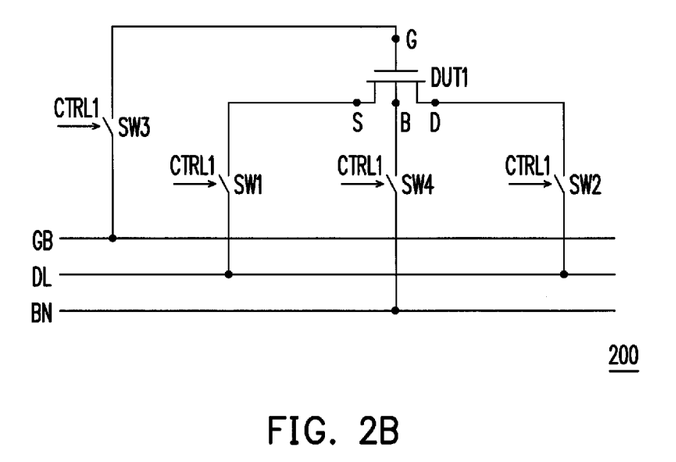
FIG. 2B is a schematic diagram of a tested unit 200 according to another embodiment of the invention.

Referring to FIG. 2B, FIG. 2B is a schematic diagram of the tested unit 200 according to another embodiment of the invention. In FIG. 2B, the bulk B and the first terminal S (the source) of the tested transistor DUT1 are isolated to each other. Under such state, similarly, by conducting the switch SW1 connected in series between the first terminal S of the tested transistor DUT1 and the leakage transporting line DL, the switch SW2 connected in series between the second terminal D of the tested transistor DUT1 and the leakage transporting line DL, the switch SW4 connected in series between the bulk B of the tested transistor DUT1 and the back-end bias providing line BN and the switch SW3 connected in series between the control terminal G of the tested transistor DUT1 and the bias providing line GB, the leakage current generated by the tested unit 200 in a non-selected state can be effectively reduced.

Figure 2C:
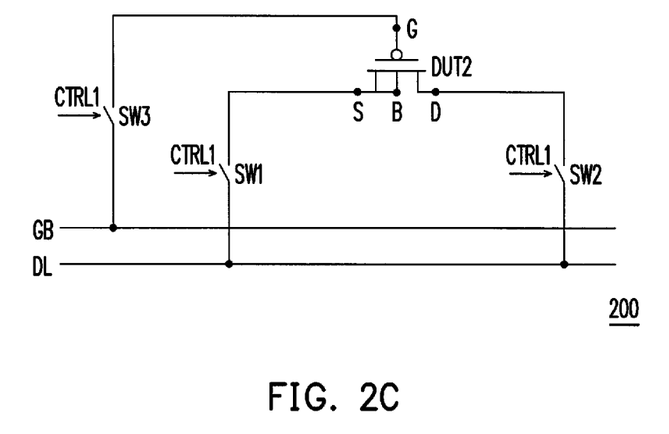
FIG. 2C and FIG. 2D respectively illustrates two implementations of a tested unit 200.
Figure 2D:
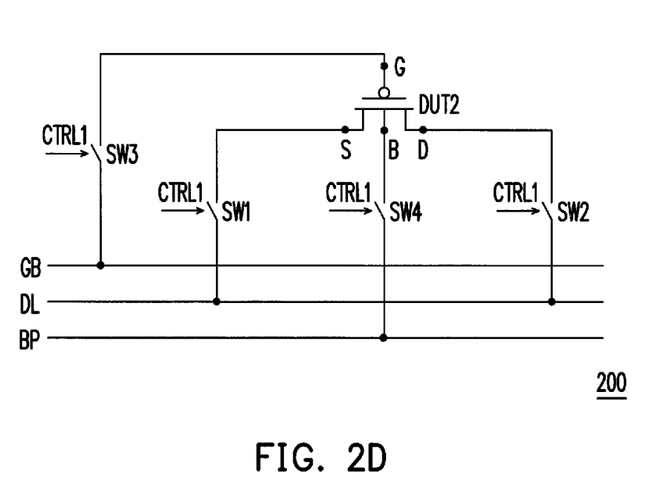

Referring to FIG. 2C and FIG. 2D, FIG. 2C and FIG. 2D respectively illustrates two implementations of the tested unit 200. In FIG. 2C, the tested unit 200 includes the tested transistor DUT1 and the switches SW1-SW3, and the tested transistor DUT1 is, for example, a P-type metal oxide semiconductor field effect transistor (PMOSFET), in which the bulk B and the first terminal S are connected to each other. In FIG. 2D, the tested unit 200 also includes the tested transistor DUT1 and the switches SW1-SW3, and the tested transistor DUT1 is, for example, a PMOSFET, in which the bulk B and the first terminal S are isolated to each other.

Regarding implementation details, the embodiments of FIG. 2C and FIG. 2D are similar to the embodiments of FIG. 2A and FIG. 2B, so that details thereof are not repeated. However, it should be noticed that one tested transistor array includes a plurality of the tested transistors. The tested transistors can be a combination of a plurality of P-type transistors and a plurality of N-type transistors. Moreover, the tested transistors can be three-terminal transistors (the bulk and the first terminal are coupled to each other) or four-terminal transistors (the bulk and the first terminal are isolated to each other). However, regardless of the configuration of the tested transistor, the method introduced in the embodiments of FIGS. 2A-2D can be used to reduce the leakage current probably generated by the tested transistor in the non-selected state.

Figure 3A:
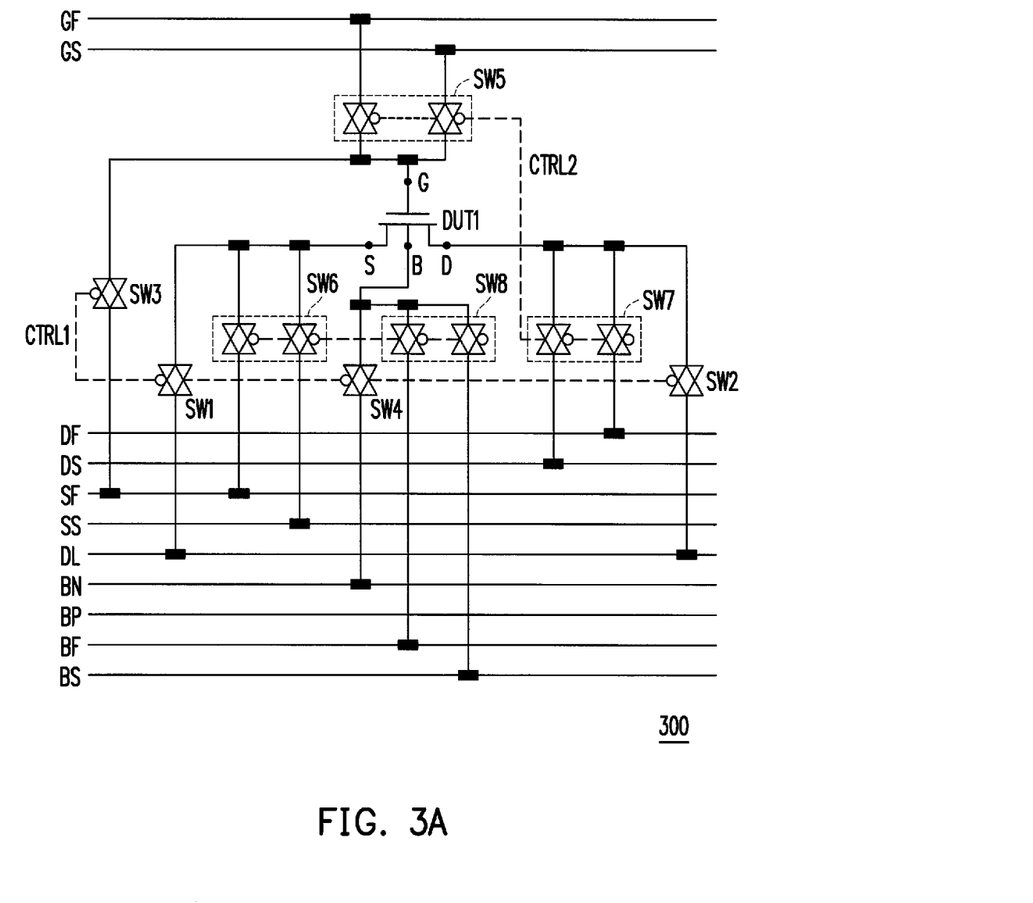
FIG. 3A is a schematic diagram of a tested unit 300 according to another embodiment of the invention.

Referring to FIG. 3A, FIG. 3A is a schematic diagram of a tested unit 300 according to another embodiment of the invention. The tested unit 300 includes the tested transistor DUT1 and switches SW1-SW8. The tested transistor DUT1 has the control terminal G, the first terminal S, the second terminal D and the bulk B. The tested transistor DUT1 is an NMOSFET. The switch SW1 is coupled in series between the first terminal S of the tested transistor DUT1 and the leakage transporting line DL. The switch SW2 is coupled in series between the second terminal D of the tested transistor DUT1 and the leakage transporting line DL. The switch SW4 is coupled in series between the bulk B of the tested transistor DUT1 and the back-end bias providing line BN, and the switch SW3 is coupled in series between the control terminal G of the tested transistor DUT1 and the bias providing line. In the present embodiment, the bias providing line and a first terminal test signal transporting line SF are the same line. The Switches SW1-SW3 are turned on or turned off according to the control signal CTRL1. Moreover, the switch SW5 is coupled between the control terminal G of the tested transistor DUT1 and control terminal test signal transporting lines GF and GS. The switch SW6 is coupled between the first terminal S of the tested transistor DUT1 and the first terminal test signal transporting lines SF and SS. The switch SW7 is coupled between the second terminal D of the tested transistor DUT1 and second terminal test signal transporting lines DF and DS. The switch SW8 is coupled between the bulk B of the tested transistor DUT1 and the bulk test signal transporting lines BF and BS. The switches SW5-SW8 are turned on or turned off according to a control signal CTRL2, and turn-on or turn-off states of the switches SW5-SW8 are inversed to that of the switches SW1-SW3.

In detail, when the tested transistor DUT1 is not selected, the switches SW1-SW3 are turned on according to the control signal CTRL1, and the switches SW5-SW8 are turned off according to the control signal CTRL2. Comparatively, when the tested transistor DUT1 is selected, the switches SW1-SW3 are turned off according to the control signal CTRL1, and the switches SW5-SW8 are turned on according to the control signal CTRL2.

It should be noticed that when the tested transistor DUT1 is selected, the switches SW5 and SW8 are turned on according to the control signal CTRL2, and the control terminal test signal transporting lines GF and GS and the bulk terminal test signal transporting lines BF and BS are used to transmit signals to the control terminal G and the bulk B of the tested transistor DUT1. The control terminal test signal transporting line GF is used to transport a voltage for applying on the control terminal G of the tested transistor DUT1, and the control terminal test signal transporting line GS provides the voltage of the control terminal G of the tested transistor DUT1 for detecting. The bulk test signal transporting line BF is used to transport a voltage for applying on the bulk B of the tested transistor DUT1, and the bulk test signal transporting line BS provides the voltage of the bulk B of the tested transistor DUT1 for detecting.

Similarly, when the tested transistor DUT1 is selected, the switches SW6 and SW7 are turned on according to the control signals CTRL2, and the first terminal test signal transporting lines SF and SS and the second terminal test signal transporting lines DF and DS are used to transmit signals to the first terminal S and the second terminal D of the tested transistor DUT1. The first and second terminal test signal transporting lines SF and DF respectively provide paths for applying voltages to the first terminal S and the second terminal D of the tested transistor DUT1, and the first and second terminal test signal transporting lines SS and DS respectively provide paths for measuring the voltages of the first terminal S and the second terminal D of the tested transistor DUT1.

In the present embodiment, the switches SW1-SW3 are respectively constructed by a transmission gate, and the switches SW5-SW8 are respectively constructed by two transmission gates.

Figure 3B:
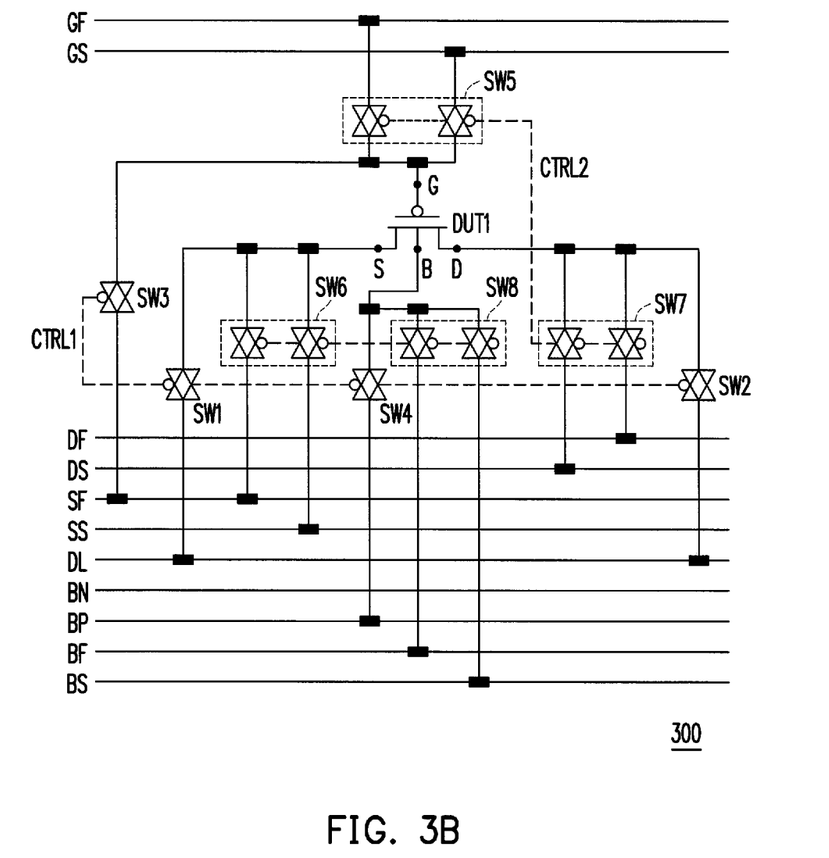
FIG. 3B is a schematic diagram of a tested unit 300 according to another embodiment of the invention.

Moreover, referring to FIG. 3B, FIG. 3B is a schematic diagram of a tested unit 300 according to another embodiment of the invention. Different to the tested unit 300 of FIG. 3A, the tested transistor DUT1 included in the tested unit 300 of FIG. 3B is a PMOSFET, and the switch SW4 is connected in series between the bulk B of the tested transistor DUT1 and the back-end bias providing line BP. Operation details of the tested unit 300 of FIG. 3 have been described in detail in the aforementioned embodiment, which are not repeated herein.

Figure 4:
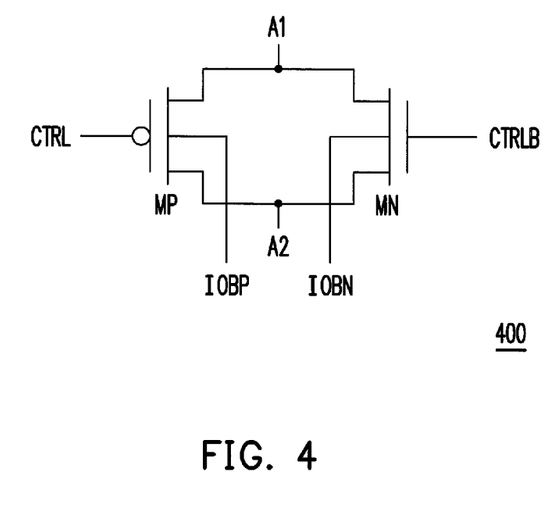
FIG. 4 is a diagram illustrating a transmission gate 400 according to an embodiment of the invention.

Referring to FIG. 4, FIG. 4 is a diagram illustrating a transmission gate 400 according to an embodiment of the invention. The transmission gate 400 includes a P-type transistor MP and an N-type transistor MN. A control terminal (for example, a gate) of the P-type transistor MP receives a control signal CTRL, and a first terminal and a second terminal of the P-type transistor MP are respectively connected to the nodes A1 and A2. A control terminal (for example, a gate) of the N-type transistor MN receives an inverted signal CTRLB of the control signal CTRL, and a first terminal and a second terminal of the N-type transistor MN are respectively connected to the nodes A1 and A2.

It should be noticed that since the transmission gate 400 probably still generates the leakage current to influence the testing result of the tested transistor array when the transmission gate 400 is turned off, a bulk of the P-type transistor MP receives a back-end bias reference voltage IOBP and a bulk of the N-type transistor MN receives a back-end bias reference voltage IOBN. When the transmission gate is set to be turned off, the back-end bias reference voltage IOBN can be a voltage smaller than 0 volt. Moreover, absolute values of the back-end bias reference voltage IOBP and the back-end bias reference voltage IOBN can be input and output voltages with relatively high voltage values (for example, the back-end bias reference voltage IOBP is equal to 2.5V and the back-end bias reference voltage IOBN is equal to −2.5V). By supplying the back-end bias reference voltages IOBN and IOBP to the bulk of the N-type transistor MN and the bulk of the P-type transistor MP, a threshold voltage of the transmission gate 400 is improved, and the probably generated leakage current is reduced.

In summary, in the invention, by conducting the first and second switches, the cross voltage of the first terminal and the second terminal of the tested transistor is reduced to reduce the leakage current. Based on conduction of the first and second switches, the first terminal and the second terminal of the tested transistor are short-circuited to the leakage transporting line, so as to take away the leakage current probably generated by the tested transistor, and reduce a chance that the leakage current influences the testing result. Moreover, the invention further provides the third and fourth switches, and the third and fourth switches are used to provide biases to the bulk and the control terminal of the tested transistor, so as to improve the threshold voltage of the tested transistor and reduce the probably generated leakage current.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A transistor array for testing, comprising:
a plurality of tested units, each of the tested units comprising:
a tested transistor, having a control terminal, a first terminal, a second terminal and a bulk;
a first switch, coupled between the first terminal of the tested transistor and a leakage transporting line;
a second switch, coupled between the second terminal of the tested transistor and the leakage transporting line; and
a third switch, coupled between the control terminal of the tested transistor and a bias providing line,
wherein the first, the second and the third switches are turned on or turned off according to a control signal, and when the tested transistor is not selected, the first, the second and the third switches are turned on according to the control signal.

2. The transistor array for testing as claimed in claim 1, wherein each of the tested units further comprises:
a fourth switch, coupled between the bulk of the tested transistor and a back-end bias providing line, wherein the fourth switch is turned on or turned off according to the control signal, and when the tested transistor is not selected, the fourth is turned on according to the control signal.

3. The transistor array for testing as claimed in claim 2, wherein when the fourth switch is turned on, the bulk of the tested units receives a back-end bias voltage from the back-end bias providing line.

4. The transistor array for testing as claimed in claim 3, wherein a voltage level of the back-end bias voltage is less than 0 volts.

5. The transistor array for testing as claimed in claim 2, wherein the first, the second, the third and the fourth switches are respectively a first, a second, a third and a fourth transmission gates.

6. The transistor array for testing as claimed in claim 5, wherein each of the first, the second, the third and the fourth transmission gates comprises:
a P-type transistor, having a control terminal, a first terminal, a second terminal and a bulk, wherein the control terminal receives the control signal, and the bulk receives a first back-end bias reference voltage; and
a N-type transistor, having a control terminal, a first terminal, a second terminal and a bulk, wherein the control terminal receives an inverted signal of the control signal, the first terminal is coupled to the first terminal of the P-type transistor, the second terminal of the N-type transistor is coupled to the second terminal of the P-type transistor, and the bulk of the N-type transistor receives a second back-end bias reference voltage,
wherein a voltage value of the second back-end bias reference voltage is smaller than 0 volt.

7. The transistor array for testing as claimed in claim 1, wherein each of the tested units further comprises:
a fifth switch, coupled between the control terminal of the tested transistor and a control terminal test signal transporting line, and turned on or turned off according to the control signal;

a sixth switch, coupled between the first terminal of the tested transistor and a first terminal test signal transporting line, and turned on or turned off according to the control signal;

a seventh switch, coupled between the second terminal of the tested transistor and a second terminal test signal transporting line, and turned on or turned off according to the control signal; and an eighth switch, coupled between the bulk of the tested transistor and a bulk test signal transporting line, and turned on or turned off according to the control signal, wherein turn-on or turn-off states of the fifth, the sixth, the seventh and the eighth switches are inversed to that of the first, the second, the third and the fourth switches.

8. The transistor array for testing as claimed in claim 1, wherein when the first and the second switches are turned on, the first terminal and the second terminal of the tested transistor are short-circuited to the leakage transporting line.

9. The transistor array for testing as claimed in claim 1, wherein when the third switch is turned on, the control terminal receives a bias voltage from the bias providing line.

10. The transistor array for testing as claimed in claim 1, wherein each of the tested transistors is a P-type transistor or an N-type transistor.

11. The transistor array for testing as claimed in claim 1, wherein the control terminal of each of the tested transistors is a gate, the first terminal of each of the tested transistors is one of a source or a drain, and the second terminal of each of the tested transistors is the other one of the source or the drain.

* * * * *

UNITED STATES PATENT AND TRADEMARK OFFICE
CERTIFICATE OF CORRECTION

PATENT NO. : 8,643,397 B2  
APPLICATION NO. : 13/245504  
DATED : February 4, 2014  
INVENTOR(S) : Hsin-Ming Hou et al.

Page 1 of 1

It is certified that error appears in the above-identified patent and that said Letters Patent is hereby corrected as shown below:

On the Title page of the patent grant, please replace item (73) Assignee's name from "Untied Microelectronics Corp." to --United Microelectronics Corp.--

Signed and Sealed this  
Twenty-first Day of April, 2015

Michelle K. Lee  
*Director of the United States Patent and Trademark Office*